(12) United States Patent
Forenz et al.

(10) Patent No.: US 6,591,636 B1
(45) Date of Patent: Jul. 15, 2003

(54) MATERIAL AND METHOD FOR COATING GLASS FORMING EQUIPMENT

(75) Inventors: Dominick J. Forenz, Hammondsport, NY (US); Anca D. Fountain, State College, PA (US); Sherry J. Gill, Westminister, SC (US); Kenneth R. Salisbury, Campbell, NY (US); Ahmad Sarhangi, Painted Post, NY (US); Kim E. Womer, Beaver Dams, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/700,015

(22) PCT Filed: May 3, 1999

(86) PCT No.: PCT/US99/09694

§ 371 (c)(1), (2), (4) Date: Nov. 3, 2000

(87) PCT Pub. No.: WO99/57071

PCT Pub. Date: Nov. 11, 1999

Related U.S. Application Data

(60) Provisional application No. 60/084,244, filed on May 5, 1998.

(51) Int. Cl.[7] .............................................. C03B 40/00

(52) U.S. Cl. ........................... 65/374.11; 65/26; 65/169; 65/170; 65/374.12; 65/374.13; 425/90; 425/107; 249/114.1; 249/115; 249/116

(58) Field of Search ............................. 65/26, 169, 170, 65/374.11, 374.12, 374.13; 425/90, 107; 249/114.1, 115, 116

(56) References Cited

U.S. PATENT DOCUMENTS

| | | | |
|---|---|---|---|
| 3,266,107 A | * | 8/1966 | Groteke |
| 4,507,189 A | | 3/1985 | Doi et al. |
| 5,556,713 A | * | 9/1996 | Leverant |
| 5,628,807 A | | 5/1997 | Yoshitake et al. |
| 5,700,307 A | * | 12/1997 | Kashiwagi et al. |

OTHER PUBLICATIONS

Powell et al., Vapor Deposition, pp. 221–247, copyright 1966.*

XREFER website, "induction heating" definition; http://www.xrefer.com/entry.jsp?xrefid=642046.*

* cited by examiner

Primary Examiner—Michael Colaianni
(74) Attorney, Agent, or Firm—Gregory V. Bean

(57) ABSTRACT

An oxidation and corrosion resistant coating is applied to glass forming equipment by physical vapor deposition. The coating material is preferably aluminum oxide.

12 Claims, No Drawings

MATERIAL AND METHOD FOR COATING GLASS FORMING EQUIPMENT

This application is a 371 of PCT/U.S. 99/09694 filed May 3, 1999 which claims benefit under 119(e) of provisional application No. 60/084, 244 filed May 5, 1998.

FIELD OF THE INVENTION

The present invention relates to protective coatings for surfaces of glass forming equipment and methods of applying the same thereto, and more particularly to protective coatings for, and methods of applying such coatings to, plungers for forming glass articles, to replace chrome coatings customarily utilized for coating such plungers.

BACKGROUND OF THE INVENTION

Chrome plating has been used on glass forming equipment for more than 40 years. Its primary function has been to provide oxidation and corrosion protection to the forming equipment substrate material. Generally the base material utilized in glass forming equipment may be either 420 stainless steel, H13 tool steel or ductile iron, depending upon the application. Although chromium plating of glass forming equipment has been utilized successfully over many years with different glass compositions, serious problems are encountered when the desired product requires a glass composition containing significant amounts of alkali and/or alkaline components. A problem results which is defined as the build-up of a corrosion product on the surface of the chromium plated forming equipment, which results in unacceptable glass matte surface.

The corrosion product is the result of a reaction involving the alkali and alkaline components of the glass, oxygen, and chromium from the chrome plated forming equipment. The reaction products have been identified as chromate compounds, namely $K_3Na(CrO_4)_2$, $BaK_2(CrO_4)_2$ and $K_3Ba_2Cr_3O_3$. If any one of the three reactants, glass components, the oxygen, or the chrome from the chrome-plated forming equipment were removed from the system, the chromate corrosion problem would cease to exist. In view of the fact that the glass composition is usually dictated by the desired end product, and oxygen is in the atmosphere, it becomes obvious that the most practical solution to the problem is to eliminate the chrome plated forming equipment.

From a pure production standpoint, the need to find a replacement for chrome electroplating of forming equipment, is based upon improved performance of the equipment, however environmental issues also adds impetus to the need for change from the use of chrome plating, since there is a need to reduce the environmental risks associated with chrome electroplating. That is, there is a global trend of hexavalent chrome emission reduction, and the substituted coating materials of the present invention help to reduce such hexavalent chrome emissions.

The chromate corrosion product does not contaminate the glass per se, but accumulates on the chrome-plated glass forming surface and necessitates the replacement thereof in order to produce acceptable ware. In U.S. Pat. No. 5,120,341 to Nozawa et al., the inventors desire to increase the strength of glass containers by decreasing contaminants actually getting into the glass. In order to reduce glass contamination, the patent suggests the use of a gaseous hydrocarbon to coat the mold parts instead of using oil, which creates bubbles and graphite contamination of the glass. In addition, the patent suggests the coating of a plunger with a ceramic or sprayed metal coating which prevents flaking of an oxide layer from the plunger into the glass. Since the ceramic coating can withstand higher temperatures than the metal coating, the patent suggests coating the tip of the plunger with the ceramic coat and the base of the plunger with a self-fluxing metal coating, which cannot withstand the higher temperatures to which the tip of the plunger is exposed.

Further, the sprayed metal coating is less abrasive than the ceramic coating and thus is utilized at the base of the plunger so as to not scratch the glass container about the mouth portion. In another embodiment, the patent suggests the use of a blown air curtain about the plunger which not only cools the plunger but is used mainly in order to prevent foreign substances from attaching to the outside surface of the plunger, which foreign substances would contaminate the newly formed glass. Finally, the patent also suggests the use of an abrasive proof layer between the moving surfaces of the plunger assembly to prevent metal dusts from contaminating the glass, which dust particles would decrease the impact strength of the formed glass container. Unlike the Nozawa et al. Patent, the present invention is not concerned with the contamination of the glass per se, but with the provision of a protective coating to protect substrate material of glass forming equipment, such as a plunger, from oxidation and corrosion.

However, in U.S. Pat. No. 4,830,655 to Franek et al., the inventors were looking for a material to avoid the chemical incompatibilities of known mold materials and glass melts in the forming of glass optical elements with high surface quality. The mold means of the Franek et al. Patent must have a monocrystalline structure and is made from material such as $Al_2O_3$, $Cr_2O_3$ (which is being avoided in the present invention), $MgAl_2O_4$ and/or $ZrO_2$. The shaping device itself is prepared by means of chip forming shaping processes (for example boring, sawing, turning, milling, etc.), from a solid piece of material with subsequent final processing of the mold surfaces (honing, polishing, burnishing, glazing, buffing, etc.). Thus, it can be seen that the Franek et al. Patent does not even contemplate the utilization of a coating applied to a substrate, but actually manufactures the shaping device from a block of material having a monocrystalline structure.

Again, unlike the Franek et al. Patent which forms its shaping device from a solid piece of material by machining the material, the present invention applies a protective coating to additional substrate material for forming glass articles. Thus it has been an object of the invention to not only avoid the utilization of chrome as a plating material, but also to provide an improved corrosion and oxidation resistant coating for glass forming equipment.

SUMMARY OF THE INVENTION

The present invention sets forth corrosion and oxidation resistant coatings and methods of applying the same to glass forming equipment to replace the use of chrome as a plating material on such equipment. Coating materials such as $Al_2O_3$, and Ni/V may be utilized and an undercoat of Ni or nickel alloy may be employed. The method of deposition onto the substrate of the forming equipment may include sputter coating and electron beam physical vapor deposition.

DESCRIPTION OF THE PREFERRED EMBODIMENTS

The criteria for material selection was based primarily upon the assumed compatibility of a material with the hot glass forming environment, specifically high temperature oxidation and corrosion resistance. Other factors such as material toxicity and availability were also considered. Initially 28 materials were selected to be deposited upon test samples in order to have a broad base from which to select the most optimum coating material.

However, since the problem of the build-up of a corrosion product manifests itself primarily on plunger surfaces utilized to form TV panels, it was important to design a test to model the production pressing process and simulate actual conditions for life and performance predictions specific to such problem. Therefore, specifically designated coated samples were cyclicly immersed in TV panel glass under controlled conditions at elevated temperatures. The controlled test conditions were glass temperature, plunger temperature, dwell (immersion) time, cycle time and test duration.

Since the initial test for the 28 selected materials was designed to simulate production process conditions, the glass temperature was maintained at 1000° C. with the plunger surface temperature controlled at 600° C. Automatic temperature control of the plunger was accomplished by blowing cooling air on the backside of the test plungers. A thermocouple linked to a pneumatically controlled valve regulated the amount of cooling air applied to the plunger. The initial control set was determined with the aid of a contact pyrometer in the plunger up position. The plunger and glass temperatures were collected throughout the test periods. At the end of each test the data was plotted to verify that stable conditions existed throughout the duration of the test.

Dwell and cycle times were set at 12 seconds and 4 cuts/minute, respectively. These times were based on the pressing of a 27 inch TV panel. In the down, or dwell position, the coated plunger was immersed in hot glass contained in a crucible inside an electric box furnace. When the dwell time cycle was reached, the plunger was retracted up and out of the glass through a hole in the furnace lid, stopping approximately 11 inches above the furnace. Test duration was standardized at 48 hours.

The test plungers were made of 420 stainless steel to represent the substrate material commonly used for plungers. A blind hole was machined into the backside of the plunger for insertion of a thermocouple to control plunger temperature. Further, a design incorporating a high temperature gasket and seating flange was used to prevent cooling air from escaping from the furnace chamber, since it was felt that excess oxygen at the coating/glass interface would skew test results. The test plungers were polished and stippled as per the standard production process.

The following is a list of the 28 materials which were deposited upon the test plunger samples and the deposition process utilized.

| Material | Deposition Process |
| --- | --- |
| Cr | Electroplate |
| $Cr_2O_3$ | Plasma Spray Coat |
| $Cr_2O_3Si$ | Plasma Spray Coat |
| CrN/CrC | Physical Vapor Deposition |
| TiC | Physical Vapor Deposition |
| TiCN | Physical Vapor Deposition |
| TiAlN | Physical Vapor Deposition |
| $TiC/Al_2O_3$ | Chemical Vapor Deposition |
| TiN | Physical Vapor Deposition |

-continued

| Material | Deposition Process |
| --- | --- |
| TiCN/TiC/TiCN/TiN | Chemical Vapor Deposition |
| McrAlY | Physical Vapor Deposition |
| Dura-Nickel 301 | Physical Vapor Deposition |
| Stellite 6 | Physical Vapor Deposition |
| MgO | Physical Vapor Deposition |
| Ni/N | Sputter Coating |
| $Al_2O_3$ | Physical Vapor Deposition |
| Nb/NbC | Physical Vapor Deposition |
| $B_4C/W$ | Physical Vapor Deposition |
| $B_4C/MO$ | Physical Vapor Deposition |
| SiC/W | Physical Vapor Deposition |
| SiC/MO | Physical Vapor Deposition |
| $ZrO_2$ | Physical Vapor Deposition |
| CoCrAlY | Physical Vapor Deposition |
| Pt/Rh | Physical Vapor Deposition |
| Ir | Physical Vapor Deposition |
| ErO | Physical Vapor Deposition |
| $TiB_2$ | Physical Vapor Deposition |
| NiWB | Electroplate |

A target deposition thickness range of about 5–10 $\mu$m was targeted, based upon the need for adequate protection from ware and to insure oxidation/corrosion protection of the 420 SS substrate material. It was felt that too thin of a coating may not hold up to the abrasive wear encountered in the production forming process over the course of long runs. Conversely, if the coating was too thick, detrimental residual tensile stresses could build-up in the deposition initiating cracks, which offer a pathway to the unprotected substrate.

After comparing the attributes of the major families of deposition processes, as they relate to the present invention, it was decided that physical vapor deposition (PVD) was best suited to meet present requirements. Chemical vapor deposition (CVD), while offering dense, well adhered depositions, requires process temperatures in excess of the base metals upper limit of 600° C. Processing above this temperature would negatively impact the mechanical properties of the 420 SS substrate as well as raise the risk of dimensional distortion.

The state of the art in spray coating technology, in terms of density and microstructure homogeneity has not advanced to the point of being useable for TV panel forming equipment applications. Plasma spray coating does not produce acceptable densities or uniformity. Another shortcoming of the spray coating technology is the need for additional finishing steps once the deposition has been completed. Electroplating is a proven technology in the glass forming industry, however, it is relatively inflexible in terms of coating materials options. The two greatest detriments associated with electroplating, however, are the environmental risks and the cost of compliance. The PVD process, especially electron beam PVD (EB-PVD) appears to satisfy several important criteria, which is further enhanced with ion beam assisted deposition (IBAD). The EB-PVD with IBAD is preferred since it has the capability of producing dense, tightly adhered coatings, with acceptable deposition rates and under controllable conditions without environment risk.

The coatings were examined for adherence, oxide formation, pitting or other indications of corrosion. Surface roughness, which was hoped to have been a key quantitative measure, displayed no correlation with performance. The most common reason for failure was poor oxidation resistance, poor in relative terms meaning that oxidation resistance was not equal to chrome electroplate. The focus of the invention has been to identify and apply materials that display the potential to exceed the performance of chrome electroplate.

Upon reviewing the results of the tests of the 28 materials deposited on the test plungers, it was determined that both $Al_2O_3$ and MgO looked exceptional after 48 hours testing. All of the coatings were deposited via the PVD process without a bond coat, with the $Al_2O_3$ and MgO being deposited by the electron beam physical vapor deposition process whereas the Ni/V was deposited by a sputtered physical vapor deposition process. Although the differences in coefficient of thermal expansion of MgO and $Al_2O_3$ with 420 SS slightly favors MgO, $Al_2O_3$ was favored based on the overall appearance of the two coatings, and the lower likelihood of sublimation with $Al_2O_3$. Further, it may be desirable to use a bond coat to match expansion coefficients between the $Al_2O_3$ and the 420 SS, such as Ni or a nickel alloy such as CoNiCrAlY, which can be applied during the same EB-PVD process that applies the $Al_2O_3$.

EXAMPLE 1

A standard plunger for forming TV panels was given a standard automatic stipple process, the stipple machine rinsed the plunger at the end of the cycle, with no other cleaning or rinsing performed on the part. The standard stipple process was set to hit a target of 30 Ra surface roughness, with subsequent plating and bead blasting yielding a finish roughness of approximately 20 Ra. The plunger was bolted to a platen and positioned face-up and rolled into a vacuum chamber. Once in the chamber the platen was rotated to give the plunger a 30° disposition angle relative to the target source. After the chamber was pumped down to $2 \times 10^{-7}$ Torr, the plunger was glow discharge cleaned with the ion beam source for 15 minutes.

The set up included a container of target material, an ion beam source, an electron beam source, a substrate holder positioned relative to the target source, and a rotational shaft to rotate the substrate holder.

| Process Set-Up: | |
|---|---|
| Target material | 99.99% pure aluminum oxide, manufactured by Cerac, 1.5–3 mm size |
| Base pressure | $2 \times 10^{-7}$ Torr |
| Deposition pressure | $O_2$ partial pressure $4 \times 10^{-5}$ Torr |
| | Ar partial pressure $2 \times 10^{-5}$ Torr |
| Electron beam gun | Voltage - 8 Killowatts |
| | Current - 1 Ampere |
| Ion beam source | Endhall |
| Ion oxygen channel | Oxygen flow rate - 120 sccm |
| | Anode voltage - 167 volts |
| | Current - 3.2 amperes |
| Ion Argon channel | Argon flow rate - 15.2 sccm |
| | Anode voltage - 18.3 volts |
| | Current - 3.41 amperes |
| Deposition angle | 30 degrees |
| Substrate RPM | .5 |
| Substrate temperature | Approximately 100° C. |
| Deposition rate | Approximately 10λ/sec. |

Evaluation of dimensional measurements on several panels showed that contour variation was not more than normal, indicating positive results. Also, based on the results from the coating trial, aluminum oxide appeared to have more lubricity than chrome plating, thus minimizing the potential frequency to lubricate the plunger. The aluminum oxide coating of about 4 μm showed no measurable loss in thickness caused by scrubbing, which is due to the very high abrasive wear resistance of $Al_2O_3$, as compared with chrome plating. The $Al_2O_3$ coating appeared to be firmly attached to the substrate, and as expected no yellow chromate was found on the plunger.

A scanning electron microscope was utilized to determine the thickness measurements of the coating on the plunger, and it was found that the coating thickness was greater in the center face and radius areas. In order to increase the thickness of the coating on the corners of the plungers, it was felt that this could be accomplished by changing the tilt angle and pausing the rotation of the substrate to concentrate the condensing vapors at each corner. The SEM analysis indicated that the overall coating was of good quality, the grain structure was columnar, and appeared dense and tightly adhered to the plunger. However, since alumina is very brittle, and there is an expansion coefficient mismatch between the alumina and the stainless steel, some microcracking was expected, and even though minimal microcracking was observed in the alumina it was sufficient for enough oxygen to reach the substrate to oxidize the iron. The problem of expansion coefficient mismatch can be easily corrected by depositing a thin (1–2 microns) oxidation resistant coating layer under the alumina, such as a layer of nickel or nickel alloy. This is easily accomplished by indexing a crucible of nickel target material under the electron gun during the coating process.

EXAMPLE 2

A stainless steel plunger for forming 27 inch TV panels was coated with aluminum oxide and utilized to press TV panels to test the efficiency of the aluminum oxide coating. The coating was applied in accordance with the following process.

Deposition Process

Plunger was processed prior to coating according to the following process:

1. Standard polish
2. Standard stipple
3. Standard glass beading
4. De-ionized water rinse
5. Methanol rinse
6. Air hose dry off Coating Parameters Base pressure: $2.8 \times 10^{-7}$ Torr
R.P.M.: 0.3 throughout 1. Cleaning process: Start 10:22 AM; Finish 10:37 AM
    RF ion source with Argon

| | |
    |---|---|
    | RF power | 400 watts |
    | Beam current | 440 watts |
    | Suppressor | 1040 volts |
    | Accelerator | 990 volts |
    | Gas | 91 sccm Ar |
    | System pressure | $8.7 \times 10^{-5}$ Torr |

2. First coating process: Start 11:03 AM; Finish 1:55 PM
    Initial Conditions:
    Ion beam:

RF source with Oxygen

| | |
    |---|---|
    | RF Power | 400 watts |
    | Beam current | 200 watts |
    | Suppressor | 518 volts |
    | Gas | 99.9 sccm $O_2$ |

-continued

Deposition angle - initially @ 25° then changed to 35° after six minutes
Electron beam gun # 1 (large hearth):

| | |
|---|---|
| Beam voltage | 8000 volts |
| Beam current | 0.7 amps |
| Controller power | 81% |
| Rate | 5.1 A/sec |
| Thickness | 0 |
| System pressure | $2.11 \times 10^{-5}$ Torr |

Final Conditions:
Ion Beam:

RF ion source with Oxygen

| | |
|---|---|
| RF power | 403 watts |
| Beam current | 273 watts |
| Suppressor | 518 volts |
| Accelerator | 912 volts |
| Gas | 102.9 sccm |
| System pressure | $1.46 \times 10^{-5}$ Torr |

Electron beam gun # 1 (large hearth):

| | |
|---|---|
| Beam voltage | 8,500 volts |
| Beam current | 0.8 amps |
| Controller power | 85% |
| Rate | 6.2 A/sec |
| Thickness | 63,800 A (at crystal) |

As a sub experiment the coating thickness in corners at the ends of one side of the plunger and designated as "A" & "D" was increased. This was done to test the theory that oxidation resistance in the corners could be improved with increased coating thickness, and was accomplished by halting the plunger rotation when corner "A" was nearest the target & held until 2,000 A was deposited. Corner "D" was then rotated into position and the process was duplicated. This process was repeated four more times to give a total of 10,000 A of additional coating thickness to each corner.

To test the lubricity of the coating, the sidewall between corners "A" & "D" and an adjacent sidewall were not prepped with Moly-di-Sulfide.

After the run of pressing several hundred TV panels, the plunger was examined and it was found that the plunger had score marks most of the way around the periphery, however, the outboard side appeared to be slightly worse. This was the adjacent sidewall which was intentionally not peppered with molyed-di-sulfide to test the lubricity of the coating. In addition, corners "A and D" which had been given thicker coating deposits, looked significantly better than the opposite corners. A pattern on the coating surface resembling flow lines which radiated outward from the gob impact location in a roughly linear manner were apparent. Due to the thinness and non-leveling nature of the aluminum oxide coating, the stipple surface on the plunger appeared to be virtually unchanged. The coating thickness on the plunger was fairly uniform except for the added thickness intentionally applied to corners "A and D". It was felt that the results of example 1 were more positive than the results obtained with example 2. The most significant change in the process of example 2 was the use of a high energy ion beam source. The higher arrival energy of the atoms affected the morphology of the coating surface and increased the residual stress in the coating. Also, the sidewall scoring could be caused by increase shear stress on the coating due to a change in the morphology, coupled with high residual stress from deposition conditions.

EXAMPLE 3

A plurality of 3 inch diameter test plungers forming a substrate of 420 stainless steel were stippled in a manner similar to that applied to plungers for forming TV panels. After being coating in a manner hereinafter set forth, the plungers were evaluated in a test furnace. Typical parameters for the experiments were 850° C. glass temperature, 600° C. plunger temperature, low humidity, 22 hours testing time, and using television panel glass composition.

Samples were rinsed with isopropyl alcohol (IPA) prior to ultrasonic (US) cycles. Each sample was placed in an evaporating dish, covered with IPA and US cleaned for 15 minutes. Samples were rinsed under running deionized (DI) water and placed in an evaporating dish covered with DI water for another 15 minutes of US cycle. The samples were then rinsed under running DI water followed by acetone rinse, and dried in a clean drying oven at about 100° C. for 15–20 minutes.

The cleaned samples were mounted on a substrate holder, the holder was mounted inside a vacuum chamber. The vacuum bell was lowered and initial operation was started to pump the chamber down to $50E^{-3}$ Torr, and a substrate heater was started at this point. The initial pumping operation was stopped and a high vacuum pump was used to finish the pump down to $5E^{-6}$ Torr inside the chamber. Argon was pumped into the chamber and the pressure, DC bias-set and RF were introduced to generate an Ar plasma. The following table sets forth various conditions of Ni/V (92% Ni, 8% V) deposition on 420 SS substrates:

| Sample # | Purpose | Pressure Millitorr | Target Volts |
|---|---|---|---|
| 71206 | Low Pressure | 0.8 | 624 |
| 71207 | Lowest stable pressure | 0.6 | 647 |
| 71208 | Hi Pressure & tensile strength | 5.0 | 491 |
| 71209 | Heat Level 1 | 0.8 | 622 |
| 71210 | Heat Level 2 | 0.8 | 619 |
| 71211 | Cr underlay 750A | 0.8 | 615 |
| 71212 | DC Bias Level 1 | 0.8 | 615 |
| 71213 | Cr underlay 1000A | 0.8 | 604 |
| 71214 | DC Bias Level 2 | 0.8 | 609 |
| 71215 | Cr underlay 1000A | 0.8 | 598 |

| Sample # | Current Amps | Dep. Time | Temp ° C. | DC Bias | Coating μm |
|---|---|---|---|---|---|
| 71206 | 0.49 | 15 | | | 4.5 |
| 71207 | 0.46 | 15 | | | 4.5 |
| 71208 | 0.62 | 15 | | | 4.5 |
| 71209 | 0.49 | 15 | 2560 | | 4.5 |
| 71210 | 0.49 | 15 | 350 | | 4.5 |
| 71211 | 0.49 | 15 | | | 4.5 |
| 71212 | 0.49 | 15 | | −100 | 4.5 |
| 71213 | 0.5 | 15 | | | 4.5 |
| 71214 | 0.5 | 15 | | −150 | 4.5 |
| 71215 | 0.51 | 15 | | | 4.5 |

As noted from the above table, sample #71208 was sputtered under higher pressure (5 millitorr versus an average 0.78 millitorr), and with lower target voltage (491 volts versus the average of 617 volts) than the other samples in the above table. Sample #71208 was the only sample at exhibited delamination problems. Samples #71209 and 71210 were heated to 250 and 300° C., respectively and samples #71212 and 71214 were sputtered under different DC bias levels. Scanning electron microscope analysis indicated that the coatings for all other samples were well adhered and uniform at approximately 4.5 μm thickness. All samples, excepting 71208 performed well in nano indentation testing as well.

EXAMPLE 4

Substrates, consisting of stippled 420 stainless steel plunger blanks were prepared, cleaned and tested as set forth in example 3. However, instead of being sputter coated as in example 3, the substrates of this example were coated by electron beam physical vapor deposition (EB-PVD). That is, the stainless steel plunger blanks were mounted on a holder and placed in a vacuum chamber on a rotating fixture. The coating material was placed in a carbon crucible and temporarily covered by a shutter to prevent splattering during the heating process. The initial and differential pumps were started to pump the vacuum chamber down to about $3-4E^{-6}$ Torr. At this point cooling water was started, along with the power for the electron beam. The high voltage power control for the electron beam was adjusted to 0.011–0.012 amps according to the level required to cause evaporation without splattering. As the coating material was bombarded by the electron beam it evaporated or sublimed. The shutter was moved aside and the coating material was deposited on the substrate. A sweep of the electron beam was adjusted to maximize available sample.

The above description of parameters for electron beam physical vapor deposition coating were valid for both this example 4 and example 5, however specifically for this example 4 an aluminum oxide target source was placed in the carbon crucible, and a substrate heater was used to achieve a measured temperature of 105° C. The power and sweep were adjusted to allow a coating at an average of 5 angstrom per second. Pressure inside the chamber reached approximate $1E^{-4}$ Torr with $O_2$ introduced to the system to assist the formation of the oxide layer. Total deposition time was 35 minutes, with the total deposition according to the crystal readout was 1.04 $\mu$m. However, according to Dektak measurements total deposition was 1.5 $\mu$m. The scanning electron microscope results indicated that the $Al_2O_3$ coating adhered well to the metal surface of the samples.

EXAMPLE 5

Metal substrates were mounted inside a vacuum chamber as in example 4 above, however magnesium oxide was placed in the carbon crucible as a target source in place of aluminum oxide. A heater was used to bring the vacuum chamber temperature to 75° C. Deposition rate was adjusted to approximate 10 angstroms per second, with beam current set at 0.005 amps. No $O_2$ was introduced into the chamber and pressure inside the chamber averaged $1E^{-4}$ Torr. The total deposition time was 67 minutes, with a total deposition of 3 $\mu$m per the crystal readout. However, the Dektak measurements showed that a coating thickness of 3.4 $\mu$m was applied. Glass testing of the plunger blanks was satisfactory with no dulling of the test glass, which is a known indicator of contamination. Analysis of the test glass showed only components of the glass and no residual material from the MgO. Scanning electron microscope results indicated that the coating adhered well to the metal surface of the samples.

Examination of the molten glass corrosion test results from examples 3, 4 and 5, indicates that $Al_2O_3$, MgO, Ni/V are all viable candidates as an alternative plunger coating for chrome plating. However, indentation test results showed that Ni/V coating was less brittle.

However, in our overall analysis, it appears that aluminum oxide is our now preferred coating material. The aluminum oxide may be used as a stand alone coating or as the top layer of a duplex coating. A stand alone coating could be used with a deposition process that prevents the microcracking of the alumina on the substrate, however, a bonding coat between the plunger and the $Al_2O_3$ functions to provide long life to the plunger by preventing microcracking in the alumina, which would result in oxygen reaching the iron substrate and oxidizing the iron. A bond coat material of commercially pure nickel is preferred between the plunger surface and the $Al_2O_3$ coating, although a nickel alloy such as CoNiCrAlY (23% Co, 46.2% Ni, 18% Cr, 12.5% Al, 0.3% Y by weight), could be used. The bonding coat compensates for the expansion mismatch between the alumina and the iron plunger, which mismatch can result in cracking in the alumina which is brittle.

The bonding or undercoat of nickel or CoNiCrAlY alloy may be applied during the same electron beam physical vapor deposition (EB-PVD) process that applies the $Al_2O_3$. Both a crucible with the $Al_2O_3$ and a crucible with the nickel or the alloy are provided within the vacuum chamber as target materials, and the nickel or alloy containing crucible is initially indexed into position of the electron beam, and after deposition of 1–2 microns of the undercoat, then the $Al_2O_3$ crucible is moved into such position so that there is a bond coat between plunger and the alumina protective coating. Finally the alumina oxide layer will be in a 7–15 micron thickness range, whether it is a stand alone coating or in combination with a bond coating. When a bond coating is used, its thickness should be about 1–2 microns. The essentials of the process are an EB-PVD with IBAD, initially applying 1–2 $\mu$m under/bond coat of nickel, a top coat of 10–15 microns $Al_2O_3$ with a production deposition rate of approximately 50–70 angstroms/sec at a pressure in the range of $10^{-5}$ Torr and a tilt angle of about 30–35 degrees from the target source.

Although we have disclosed the now preferred embodiments of the invention, it will be apparent to those skilled in the art that various changes and modifications may be made thereto without departing from the spirit or scope of the invention as set forth in the appending claims.

We claim:

1. Glass forming equipment comprising, a substrate selected from the group consisting of 420 stainless steel, H13 tool steel and ductile iron; an oxidation and corrosion resistant coating of $Al_2O_3$; and said coating applied on the substrate by physical vapor deposition.

2. Glass forming equipment having an oxidation and corrosion resistant coating as defined in claim 1 including a bonding coating between said substrate and said oxidation and corrosion resistant coating selected from the group consisting of commercially pure Ni and a nickel alloy, and said bonding coating applied to the substrate by electron beam physical vapor deposition.

3. A method of protecting glass forming equipment from oxidation and corrosion which comprises, providing glass forming equipment containing Fe, providing an oxidation and corrosion resistant coating material containing $Al_2O_3$, cleaning the glass forming equipment, applying the oxidation and corrosion resistant coating to the glass forming equipment by means of physical vapor deposition.

4. A method of protecting glass forming equipment from oxidation and corrosion as defined in claim 3 including the steps of providing an aluminum oxide coating material, and applying said aluminum oxide to said glass forming equipment by means of an electron beam physical vapor deposition (EB-PVD) process.

5. A method of protecting glass forming equipment from oxidation and corrosion as defined in claim 4 including the step of applying said aluminum oxide with ion beam assisted deposition (IBAD).

6. A method of protecting glass forming equipment from oxidation and corrosion as defined in claim 4 including the step of forming a layer of aluminum oxide on said glass forming equipment with a thickness of between 7 and 15 microns.

7. A method of protecting glass forming equipment from oxidation and corrosion as defined in claim 6 including the steps of providing a bonding coating selected from the group consisting of Ni and a nickel alloy, and initially applying said bonding coating directly to said glass forming equipment with a thickness of about 1–2 microns so as to lie between said glass forming equipment and said aluminum oxide coating, such that the combined thickness of both coatings is between 7 and 15 microns.

8. A method of protecting glass forming equipment from oxidation and corrosion which comprises:

providing glass forming equipment containing iron for forming molten glass, providing a bonding material, applying said bonding material to said glass forming equipment by an electron beam physical vapor deposition process, providing a coating material of commercially pure aluminum oxide, applying said aluminum oxide coating material to said glass forming equipment by an electron beam physical vapor deposition process with ion beam assisted deposition, and forming an aluminum oxide coating thickness of between about 7 and 15 microns.

9. A method of protecting glass forming equipment from oxidation and corrosion as defined in claim 8 including the steps of providing a bonding material containing nickel and applying said bonding material to said glass forming equipment during said aluminum oxide coating process but prior to the actual application of the aluminum oxide, so as to form a bonding layer between said glass forming equipment and the aluminum oxide coating.

10. A method of protecting glass forming equipment from oxidation and corrosion as defined in claim 9 including the steps of forming a bonding layer thickness of about 1 to 2 microns and a total combined coating thickness not exceeding about 15 microns.

11. A method of protecting glass forming equipment from oxidation and corrosion as defined in claim 9 including the steps of providing separate target sources by placing both the nickel containing bonding material and the aluminum oxide coating material in separate target source containers within a vacuum chamber, positioning the glass forming equipment within the vacuum chamber, creating a vacuum within the chamber within the range of plus or minus 10% of an x times $10^{-5}$ Torr vacuum, subjecting the bonding material first to the electron beam, and after forming the bonding layer on the glass forming equipment, subjecting the aluminum oxide material to the electron beam to form a protective coating.

12. A method of protecting glass forming equipment from oxidation and corrosion as defined in claim 11 including the steps of placing a surface of the glass forming equipment to be coated at an angle of between about 30 and 35 degrees relative to the target source.

* * * * *